(12) United States Patent
Chang et al.

(10) Patent No.: US 9,105,650 B2
(45) Date of Patent: Aug. 11, 2015

(54) LATERAL BIPOLAR TRANSISTOR AND CMOS HYBRID TECHNOLOGY

(71) Applicant: International Business Machines Corporation, Armonk, NY (US)

(72) Inventors: Josephine B. Chang, Yorktown Heights, NY (US); Gen Pei Lauer, Yorktown Heights, NY (US); Isaac Lauer, Yorktown Heights, NY (US); Jeffrey W. Sleight, Yorktown Heights, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/186,512

(22) Filed: Feb. 21, 2014

(65) Prior Publication Data

US 2014/0170829 A1     Jun. 19, 2014

Related U.S. Application Data

(63) Continuation of application No. 13/610,961, filed on Sep. 12, 2012, now abandoned.

(51) Int. Cl.
*H01L 29/66* (2006.01)
*H01L 29/73* (2006.01)
*H01L 21/84* (2006.01)

(52) U.S. Cl.
CPC .......... *H01L 29/66265* (2013.01); *H01L 21/84* (2013.01); *H01L 29/6625* (2013.01); *H01L 29/7317* (2013.01)

(58) Field of Classification Search
CPC ...................................................... H01L 21/84
USPC ........................ 257/347, E21.421, E29.255
See application file for complete search history.

(56) References Cited

U.S. PATENT DOCUMENTS

| | | | |
|---|---|---|---|
| 4,581,319 A | 4/1986 | Wieder et al. | |
| 5,101,256 A | 3/1992 | Harame et al. | |
| 5,198,375 A | 3/1993 | Hayden et al. | |
| 5,399,230 A | 3/1995 | Takatani et al. | |
| 6,127,225 A | 10/2000 | Liu et al. | |
| 6,187,641 B1 | 2/2001 | Rodder et al. | |
| 6,359,298 B1 | 3/2002 | Krishnan | |
| 6,384,439 B1 | 5/2002 | Walker | |
| 6,660,598 B2 * | 12/2003 | Hanafi et al. | 438/291 |

(Continued)

FOREIGN PATENT DOCUMENTS

WO     2006109221 A2     10/2006

*Primary Examiner* — Yu-Hsi D Sun
*Assistant Examiner* — Ankush Singal
(74) *Attorney, Agent, or Firm* — Cantor Colburn LLP; Vazken Alexanian

(57) ABSTRACT

A method of forming a lateral bipolar transistor includes forming a silicon on insulator (SOI) substrate having a bottom substrate layer, a buried oxide layer (BOX) on top of the substrate layer, and a silicon on insulator (SOI) layer on top of the BOX layer, forming a dummy gate and spacer on top of the silicon on insulator layer, doping the SOI layer with positive or negative ions, depositing an inter layer dielectric (ILD), using chemical mechanical planarization (CMP) to planarize the ILD, removing the dummy gate creating a gate trench which reveals the base of the dummy gate, doping the dummy gate base, depositing a layer of polysilicon on top of the SOI layer and into the gate trench, etching the layer of polysilicon so that it only covers the dummy gate base, and applying a self-aligned silicide process.

12 Claims, 10 Drawing Sheets

(56) References Cited

U.S. PATENT DOCUMENTS

| | | |
|---|---|---|
| 6,858,532 B2 | 2/2005 | Natzle et al. |
| 6,930,030 B2 | 8/2005 | Rausch et al. |
| 6,936,910 B2 | 8/2005 | Ellis-Monaghan et al. |
| 6,939,764 B2 | 9/2005 | Chen et al. |
| 7,285,454 B1 | 10/2007 | Liang et al. |
| 7,307,336 B2 | 12/2007 | Ehwald et al. |
| 7,543,917 B2 | 6/2009 | Dodd et al. |
| 7,696,624 B2 | 4/2010 | Marsh |
| 7,893,496 B2 | 2/2011 | Peidous et al. |
| 7,910,447 B1 | 3/2011 | Xu et al. |
| 7,911,033 B2 | 3/2011 | Yu |
| 7,977,751 B2 | 7/2011 | Nagaoka et al. |
| 8,330,223 B2 | 12/2012 | Schimpf et al. |
| 2001/0008298 A1 | 7/2001 | Sato |
| 2001/0053595 A1 | 12/2001 | Hineman |
| 2002/0031909 A1 | 3/2002 | Cabral, Jr. et al. |
| 2002/0037619 A1 | 3/2002 | Sugihara et al. |
| 2003/0008496 A1 | 1/2003 | Deleonibus |
| 2004/0110354 A1 | 6/2004 | Natzle et al. |
| 2005/0001319 A1 | 1/2005 | Hackler et al. |
| 2005/0048729 A1* | 3/2005 | Yoon et al. .................. 438/303 |
| 2005/0112811 A1 | 5/2005 | Hsu et al. |
| 2005/0260801 A1 | 11/2005 | Divakaruni et al. |
| 2006/0038241 A1 | 2/2006 | Matsuo |
| 2006/0043484 A1 | 3/2006 | Cabral et al. |
| 2006/0060941 A1 | 3/2006 | Sun et al. |
| 2007/0096219 A1 | 5/2007 | Akino |
| 2007/0108514 A1 | 5/2007 | Inoue et al. |
| 2008/0197426 A1 | 8/2008 | Okazaki |
| 2008/0268604 A1 | 10/2008 | Geiss et al. |
| 2009/0224338 A1 | 9/2009 | Nagaoka |
| 2011/0079851 A1 | 4/2011 | Li et al. |
| 2011/0121363 A1 | 5/2011 | Cheng et al. |
| 2012/0007051 A1 | 1/2012 | Bangsaruntip et al. |
| 2012/0037991 A1 | 2/2012 | Guo et al. |
| 2012/0104498 A1 | 5/2012 | Majumdar et al. |
| 2012/0132961 A1 | 5/2012 | Vanhoucke et al. |
| 2012/0205728 A1 | 8/2012 | Yin et al. |
| 2012/0261754 A1 | 10/2012 | Cheng et al. |
| 2012/0313216 A1 | 12/2012 | Cai et al. |

* cited by examiner

LATERAL BIPOLAR TRANSISTOR AND CMOS HYBRID TECHNOLOGY

CROSS-REFERENCE TO RELATED APPLICATION

This application is a continuation of U.S. patent application Ser. No. 13/610,961, filed Sep. 12, 2012, now abandoned, the disclosure of which is incorporated by reference herein in its entirety.

BACKGROUND OF THE INVENTION

1. Field of the Invention

The present invention relates to a semiconductor structure and a method of fabricating the same. In particular, the present invention relates to fabricating bipolar transistors.

2. Description of Related Art

Bipolar transistors are electronic devices with two P-N junctions that are in close proximity to each other. A typical bipolar transistor has three device regions: an emitter, a collector, and a base disposed between the emitter and the collector. Ideally, the two P-N junctions, i.e., the emitter-base and collector-base junctions are in a single layer of semiconductor material separated by a specific distance. Modulation of the current flow in one P-N junction by changing the bias of the nearby junction is called "bipolar-transistor action".

If the emitter and collector are doped n-type and the base is doped P-type, the device is an "NPN" transistor. Alternatively, if the opposite doping configuration is used, the device is a "PNP" transistor. Because the mobility of minority carriers, i.e., electrons, in the base region of NPN transistors is higher than that of holes in the base of PNP transistors, higher-frequency operation and higher-speed performances can be obtained with NPN transistor devices. Therefore, NPN transistors are the majority of bipolar transistors used to build integrated circuits.

Despite the prevalence of Complementary Metal-Oxide Semiconductor (CMOS) Field Effect Transistors (FET), bipolar transistors have superior device attributes in some areas. This is especially true for analog and power gain applications. Conventional bipolar transistor devices require abrupt emitter to base junctions and well controlled base region lengths. However, they are not formed with circuit density of CMOS structures. Traditional bipolar transistors can have collector current densities approaching 100 mA/$\mu$m². However, useful current densities are almost ten times lower, (around 10 mA/$\mu$m²) because of the Kirk effect (also known as base push out). Thus, these traditional bipolar transistors are not suitable for operation in saturation or in reverse-active mode. If such a device is in saturation, the charge stored in base and collector regions and the device becomes very slow. Also, techniques for reducing saturation increases power dissipation.

SUMMARY OF THE INVENTION

In one aspect of the invention a method of forming a lateral bipolar transistor is provided. The method includes forming a silicon on insulator (SOI) substrate having a bottom substrate layer, a buried oxide layer (BOX) on top of the substrate layer, and a silicon on insulator (SOI) layer on top of the BOX layer, forming a dummy gate and spacer on top of the silicon on insulator layer, doping the SOI layer with positive or negative ions, depositing an inter layer dielectric (ILD), using chemical mechanical planarization (CMP) to planarize the ILD, removing the dummy gate creating a gate trench which reveals the base of the dummy gate, doping the dummy gate base, depositing a layer of polysilicon on top of the SOI layer and into the gate trench, etching the layer of polysilicon so that it only covers the dummy gate base, and applying a self-aligned silicide process.

In another aspect of the invention, another method of forming a lateral bipolar transistor is provided. The method includes forming a silicon on insulator (SOI) substrate having a bottom substrate layer, a buried oxide layer (BOX) on top of the substrate layer, and a silicon on insulator (SOI) layer on top of the BOX layer, forming a dummy gate and spacer on top of the silicon on insulator layer, doping the SOI layer with positive or negative ions, depositing an inter layer dielectric (ILD), using chemical mechanical planarization (CMP) to planarize the ILD, removing the dummy gate creating a gate trench which reveals the base of the dummy gate, doping the dummy gate base, forming inner spacers on the sidewalls of the gate trench, depositing a layer of polysilicon on top of the SOI layer and into the gate trench, etching the layer of polysilicon so that it only covers the dummy gate base, and applying a self-aligned silicide process.

In yet another aspect of the invention, another method of forming a lateral bipolar transistor is provided. The method includes forming a silicon on insulator (SOI) substrate having a bottom substrate layer, a buried oxide layer (BOX) on top of the substrate layer, and a silicon on insulator (SOI) layer on top of the BOX layer, forming a dummy gate and spacer on top of the silicon on insulator layer, doping the SOI layer with positive or negative ions, depositing an inter layer dielectric (ILD), using chemical mechanical planarization (CMP) to planarize the ILD, removing the dummy gate creating a cavity that reveals the base of the dummy gate, doping the dummy gate base, growing epitaxially the base contact to the same level as the planarized ILD, and applying a self-aligned silicide process.

In a final aspect of the invention, another method of forming a lateral bipolar transistor is provided. The method includes forming a silicon on insulator (SOI) substrate having a bottom substrate layer, a buried oxide layer (BOX) on top of the substrate layer, and a silicon on insulator (SOI) layer on top of the BOX layer, forming a dummy gate and spacer on top of the silicon on insulator layer, doping the SOI layer with positive or negative ions, depositing an inter layer dielectric (ILD), using chemical mechanical planarization (CMP) to planarize the ILD, removing the dummy gate creating a gate trench which reveals the base of the dummy gate, doping the dummy gate base, adding inner spacers on the sidewalls of the gate trench, removing the ILD, and applying self-aligned silicide process.

BRIEF DESCRIPTION OF THE SEVERAL VIEWS OF THE DRAWINGS

For a more complete understanding of the present invention and the advantage thereof, reference is now made to the following description taken in conjunction with the accompanying drawings.

DETAILED DESCRIPTION

Figure 1:
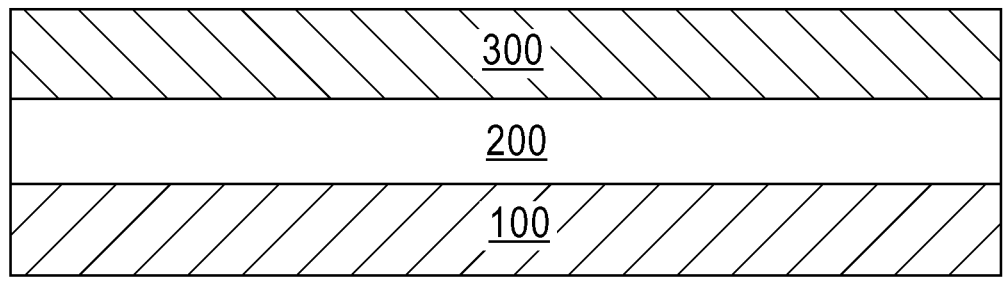
FIG. 1 illustrates a substrate.

The embodiments of the invention and the various features and advantageous details thereof are explained more fully with reference to the non-limiting embodiments that are illustrated in the accompanying drawings and detailed in the following description. It should be noted that the features illustrate in the drawings are not necessarily drawn to scale. Descriptions of well-known components and processing techniques are omitted so as to not unnecessarily obscure the embodiments of the invention.

The examples used herein are intended merely to facilitate an understanding of ways in which the embodiments of the invention may be practiced and to further enable those of skill in the art to practice the embodiments of the invention. Accordingly, the examples should not be construed as limiting the scope of the embodiments of the invention. It will also be understood that when a layer is referred to as being "on" another layer or substrate, it can be directly on the other layer or substrate, or intervening layers may also be present.

The proposed invention creates a novel way to create a lateral PNP or NPN bipolar transistor. The process uses a dummy gate or "gate first" process with doping and contacting the base region of the bipolar device. The advantages of this technique are that it can be used in combination with either implant and/or solid source diffusion to make abrupt junction base regions. While forming lateral bipolar regions, other regions can be processed with a conventional replacement gate flow for CMOS FETs. Doing this allows for both bipolar devices and CMOS FETs to lie on the same chip, allowing a designer to decide which device is best. The proposed invention will also solve the above mentioned problems by eliminating the Kirk effect (base pushout effect) so that there is no degradation of performance and eliminate performance issues for operations in saturation.

Although the embodiments of the present invention have been described hereinabove, the present invention is not limited to the foregoing embodiments. The specific embodiments discussed are merely illustrative of specific ways to make and use the invention, and do not limit the scope of the invention.

In FIG. 1, a shallow trench isolation (STI) is used to define a silicon active area in a silicon-on-insulator (SOI) substrate (not shown). Namely, a substrate, i.e., substrate, is provided. The substrate can comprise any suitable insulator material including, but not limited to, dielectric materials, such as silicon dioxide ($SiO_2$). The SOI wafer includes a silicon substrate (100), buried oxide layer (BOX) (200), and a silicon on insulator layer 300. The silicon substrate (100) can have a thickness between 500 μm and 1000 μm, but preferably between 700 μm and 800 μm. The BOX layer (200) can have a thickness between 20 μm and 300 μm, but preferably between 70 μm and 150 μm. The silicon on insulator layer (300) can have a thickness between 10 μm and 200 μm, but preferably between 50 μm and 120 μm. According to an exemplary embodiment, the substrate has a nitride layer thereon. A trench is etched in the nitride layer and silicon is deposited in the trench to form a silicon layer. Excess silicon can be removed from the silicon layer using a planarization technique, such as chemical mechanical planarization (CMP).

Figure 2:
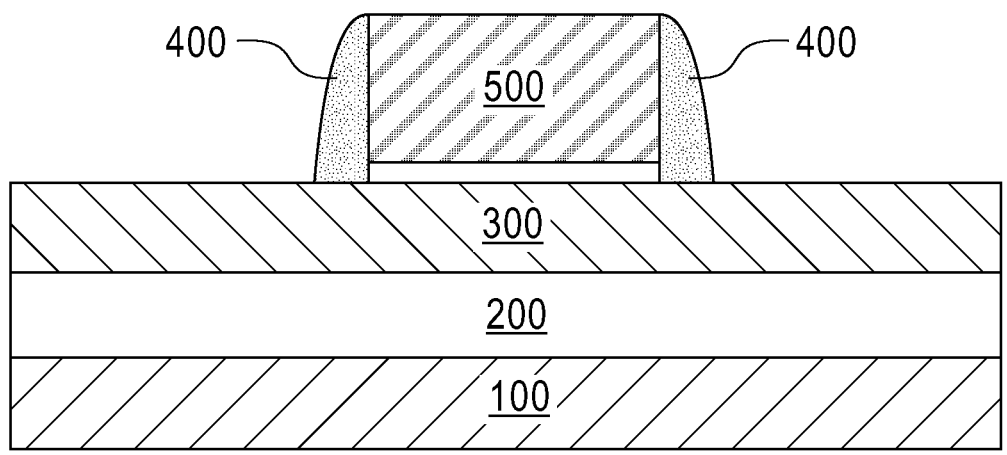
FIG. 2 illustrates a dummy gate formation.

In FIG. 2, a dummy gate (500) is then formed. The dummy gate structure (500) is formed by a polycrystalline silicon (polysilicon). According to an exemplary embodiment, dummy gate (500) is formed by first depositing a polysilicon layer and using LPCVD to a thickness of between about 100 nm and about 150 nm, e.g., about 140 nm. Since the thickness of the polysilicon layer will determine a height of the dummy gate (500), CMP may be used after deposition to achieve the desired thickness height. Resist is then deposited on the polysilicon layer, masked and patterned with the dummy gate footprint. According to an exemplary embodiment, dummy gate (500) has a height of between about 20 nm and about 200 nm, but preferably between 30 nm to 80 nm. The length of the dummy gate will between about 5 nm and 100 nm, but preferably between 10 nm and 40 nm. A spacer insulation layer (not shown) may be deposited over the entire surface and etched to form sidewall spacers (400). The sidewall spacers (400) can have a thickness between 5 nm and 30 nm, but preferably between 7 nm to 15 nm. The height of the sidewall spacers (400) can be between 20 nm and 200 nm, but preferably between 30 nm and 80 nm.

Figure 3:
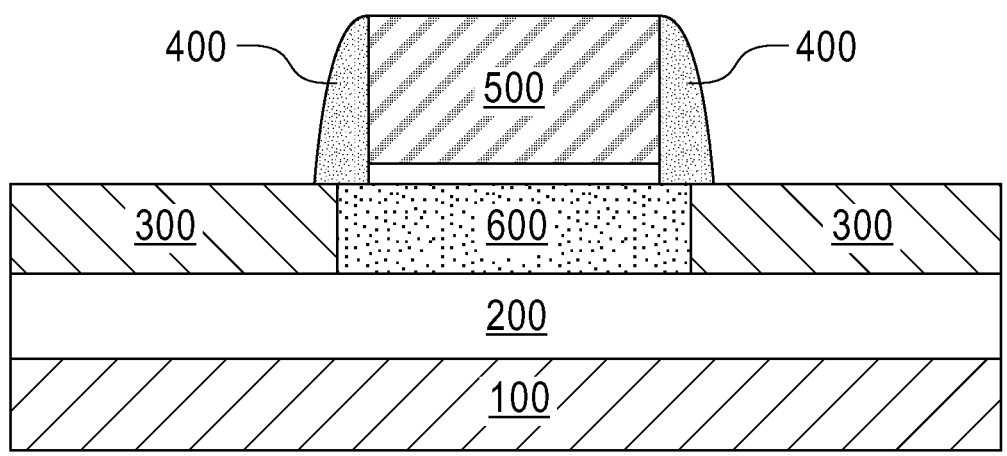
FIG. 3 illustrates doping the collector or emitter region.

In FIG. 3, the structure is then doped on both sides of the dummy gate (500) (either N+ or P+) utilizing a conventional doping process. The doping can be also be administered by solid source diffusion. The doses can be between 5E18 atoms/$cm^3$ to 5E20 atoms/$cm^3$, but preferably between 5E19 atoms/$cm^3$ to 2E20 atoms/$cm^3$. In an NPN transistor, both sides of dummy the gate will typically receive a number of successive implants of boron ions at various energies. In a PNP transistor, both sides of the dummy gate (500) will typically receive successive implantation steps of either arsenic or phosphoric ions. The gate base region of the silicon on insulator substrate (300) is indicated as (600) in the figures.

Figure 4:
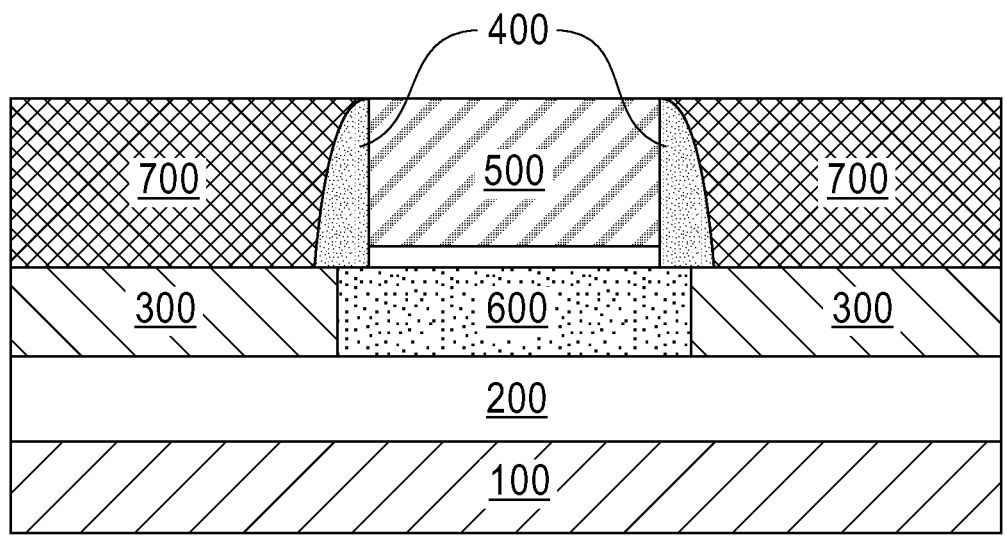
FIG. 4 illustrates deposition of an interlayer dielectric and planarization.
Figure 5:
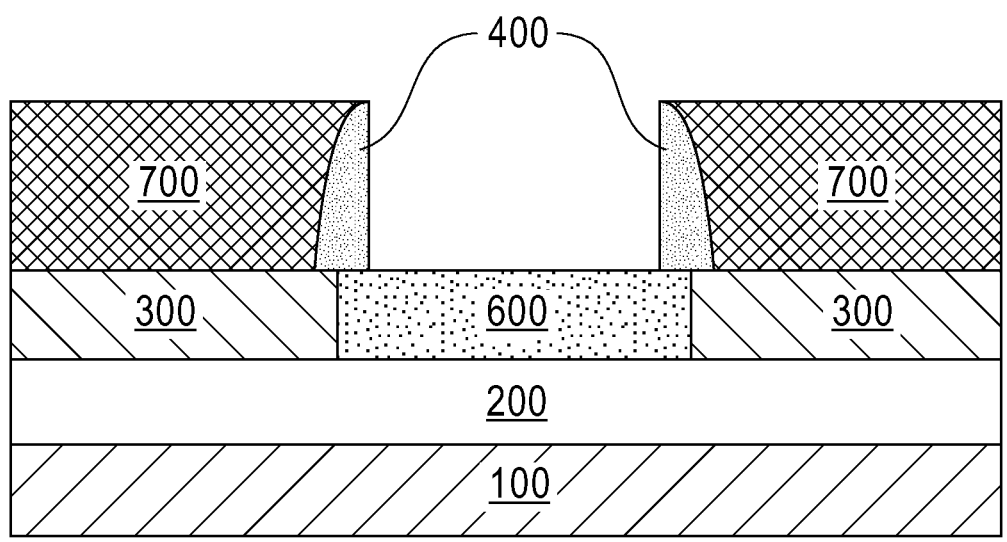
FIG. 5 illustrates removal of the dummy gate.

In FIG. 4, a filler layer (700) is deposited around the dummy gate. The filler layer (700) can include any suitable filler material, including a dielectric, such as $SiO_2$. According to an exemplary embodiment, filler layer (700) is deposited around dummy gate using inter-layer dielectric (ILD). The structure is planarized using a planarization process such as CMP, using the top of the dummy gate (500) as an etch stop. In FIG. 5, the dummy gate (500) is then removed. Specifically, the dummy gate (500) is removed by a wet method or dry method and the gate oxide layer is exposed, thereby forming a gate trench and exposing the gate base (600).

Figure 6:
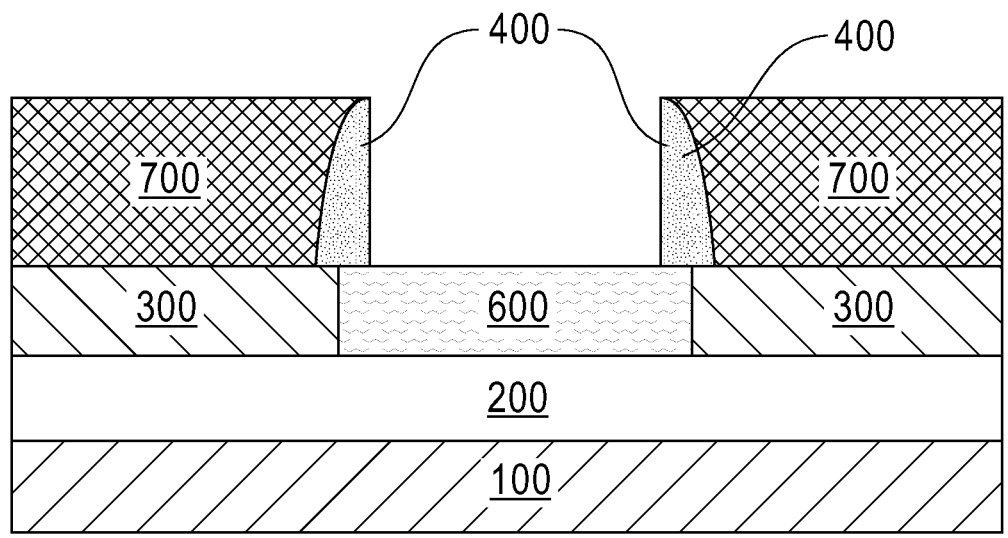
FIG. 6 illustrates doping the base region.

In FIG. 6, the gate base region (600) is then doped. The base regions can be doped by either: (i) solid source diffusion; or (ii) doping agent implant. In the solid-source diffusion technique, a dopant-containing material (the solid source) is deposited on the semiconductor to be doped. An elevated temperature treatment is then performed to allow the dopants in the dopant-containing material or solid-source to diffuse into the semiconductor. Examples of dopant-containing materials include boro-silicate glass (BSG), phospho-silicate glass (PSG), doped germanium, etc. Alternatively, the base implant doping can be applied at an angle to the perpendicular to fine tune the desired base-collector doping level gradient. According to an embodiment of the present invention, a doping agent can be a boron (p-type) or phosphorous (n-type).

Figure 7:
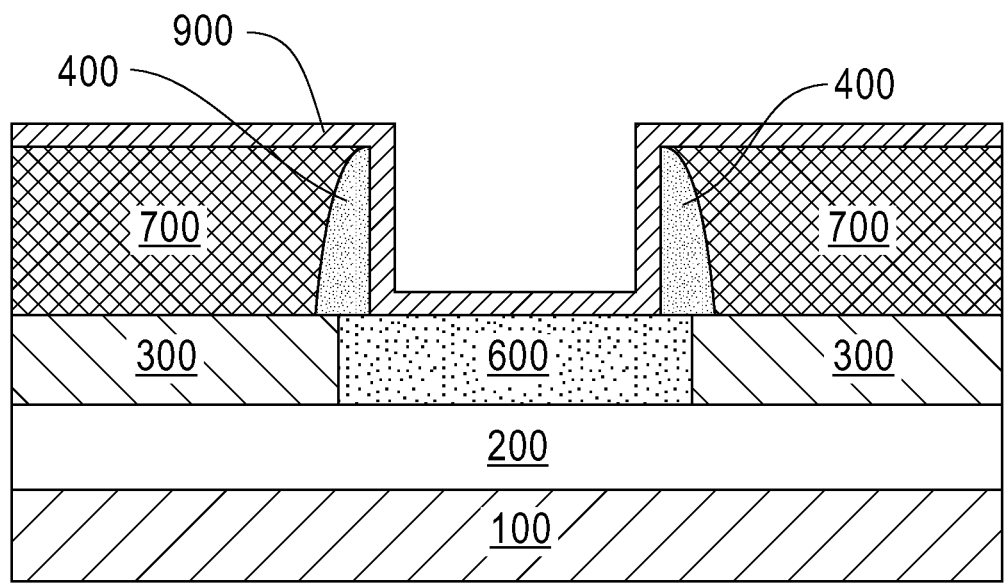
FIG. 7 illustrates depositing a polysilicon layer.
Figure 8:
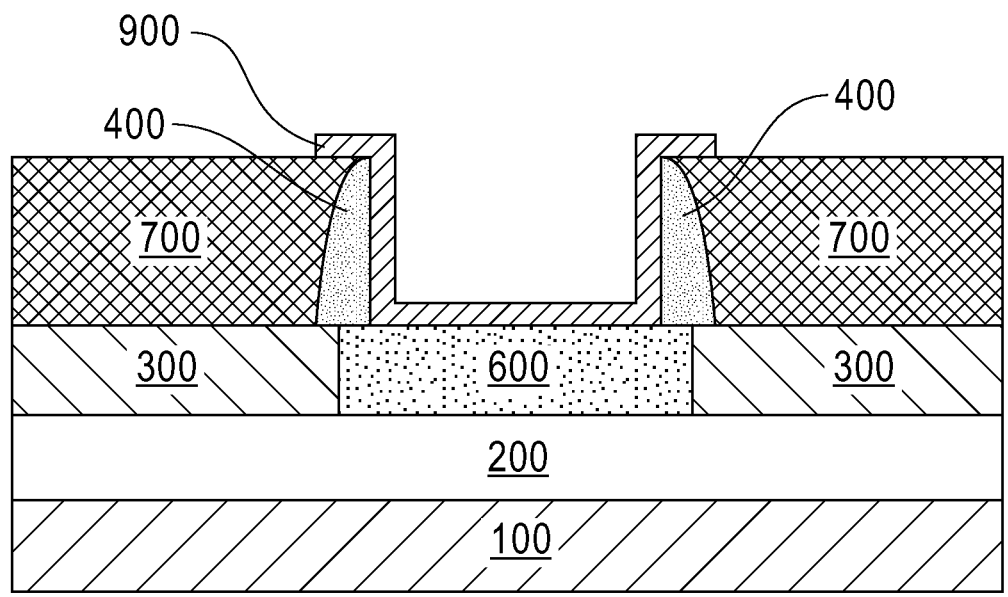
FIG. 8 illustrates patterning the polysilicon layer.
Figure 9:
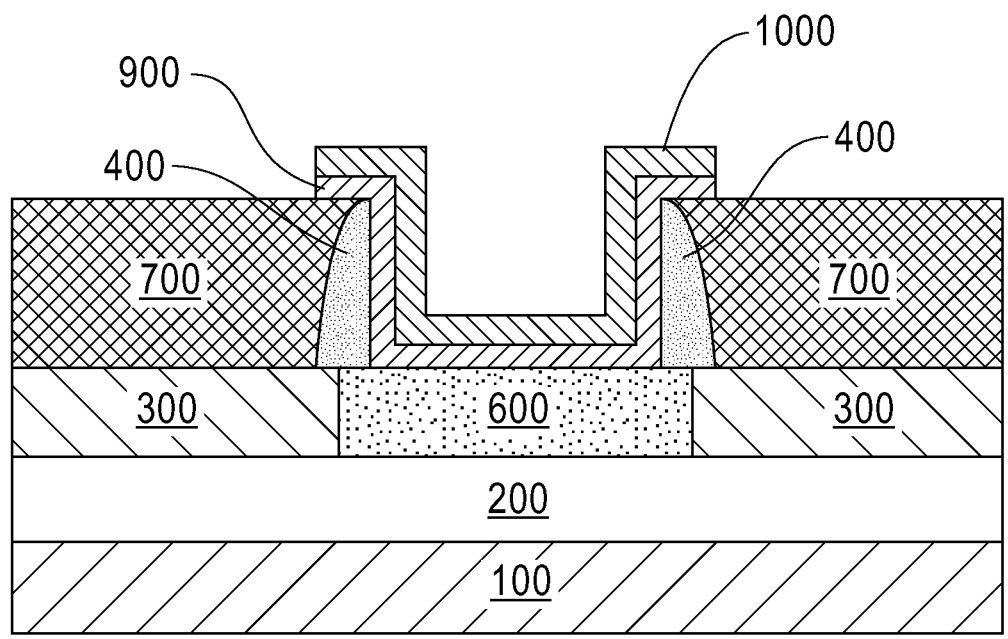
FIG. 9 illustrates depositing a silicide layer on top of the polysilicon layer.
Figure 10:
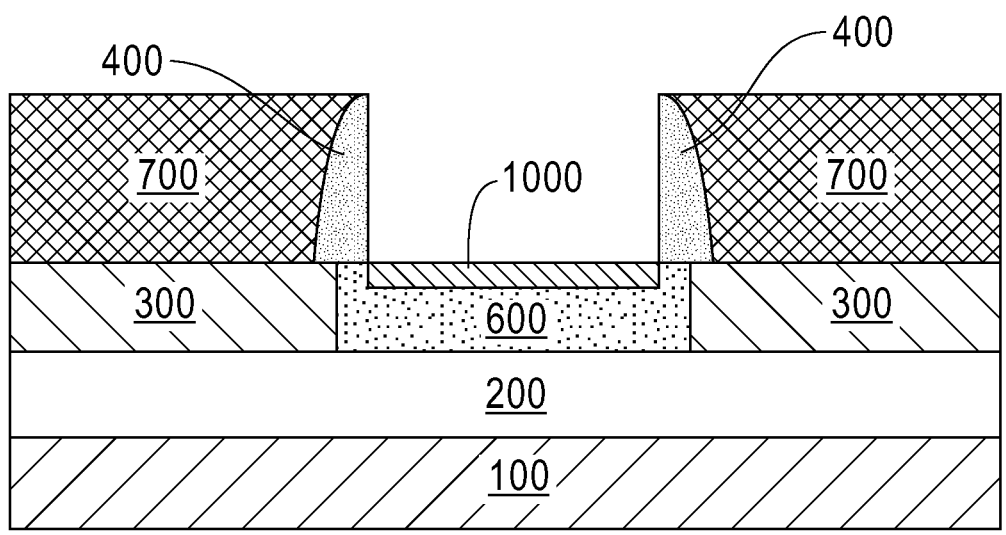
FIG. 10 illustrates forming a self aligned silicide according to one aspect of the invention.

In FIG. 7, a polysilicon layer (900) is then deposited on top of the structure and into the gate base. The polysilicon layer (900) can have a thickness of 5 nm and 30 nm, but preferably between 10 nm and 15 nm. In FIG. 8, the polysilicon layer (900) is then patterned so that it is covering the gate base region. In FIG. 9, a self-aligned silicide region (1000) is formed on the gate base region. According to an exemplary embodiment, the silicide region (1000) is formed by first depositing a non-transition metal, such as nickel-platinum (NiPt) on the gate base region, and then annealing to form the silicide. After silicide formation, any standard middle-of-the-line complementary metal-oxide-semiconductor (CMOS) processes including middle-of-the-line dielectric deposition, contact stud patterning, metal patterning and metallization can be implemented. In FIG. 10, the resulting structure according to one aspect of the invention is formed.

Figure 11:
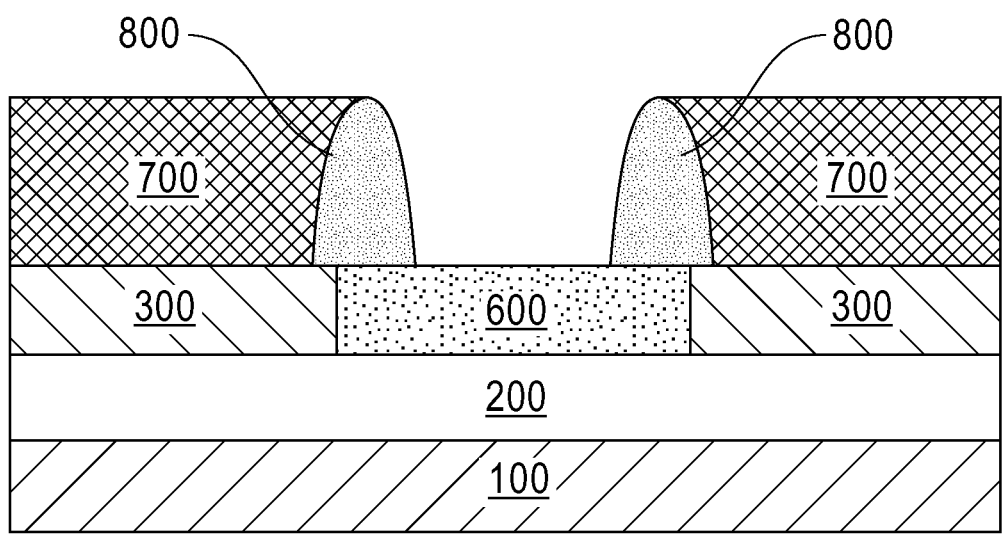
FIG. 11 illustrates adding spacers after removing the dummy gate according to one aspect of the invention.

In FIG. 11, an inner spacer can be added after the base is doped in another aspect of the invention. Placing spacers (800) between what will be the collector/emitter regions of the device and the device contact will help to minimize parasitic capacitance in the completed device. According to an exemplary embodiment, spacers (800) are formed by first depositing a nitride layer into trench. The spacers (800) can have a thickness between 5 nm and 30 nm, but preferably between 7 nm to 15 nm. The height of the sidewall spacers (800) can be between 20 nm and 200 nm, but preferably between 30 nm and 80 nm. A resist film is then deposited on the nitride layer, masked and patterned with the spacer footprints. A nitride-selective RIE is then used to define spacers in the nitride layer.

Figure 12:
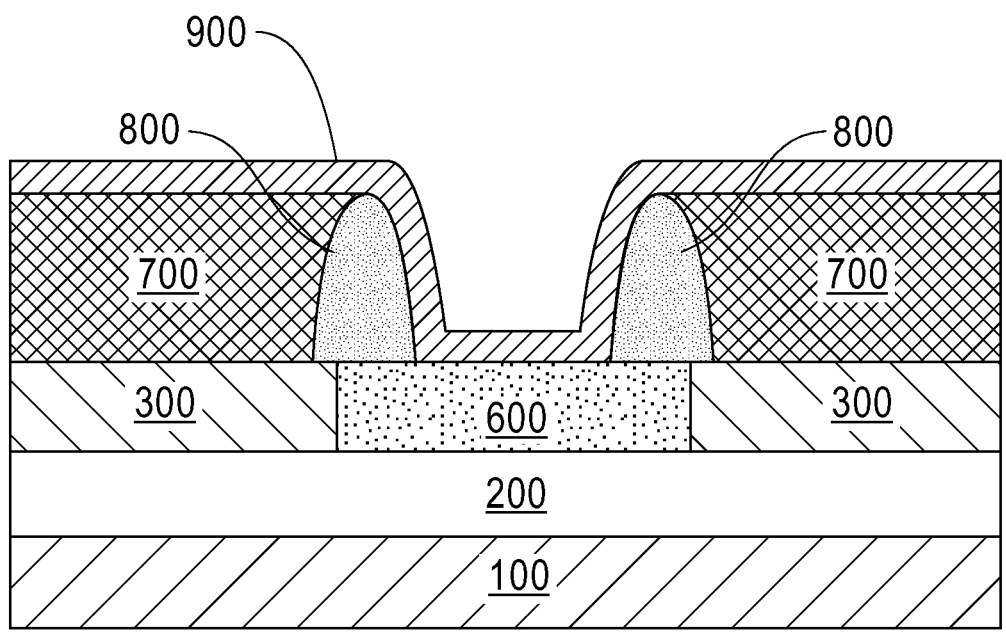
FIG. 12 illustrates depositing a polysilicon layer.
Figure 13:
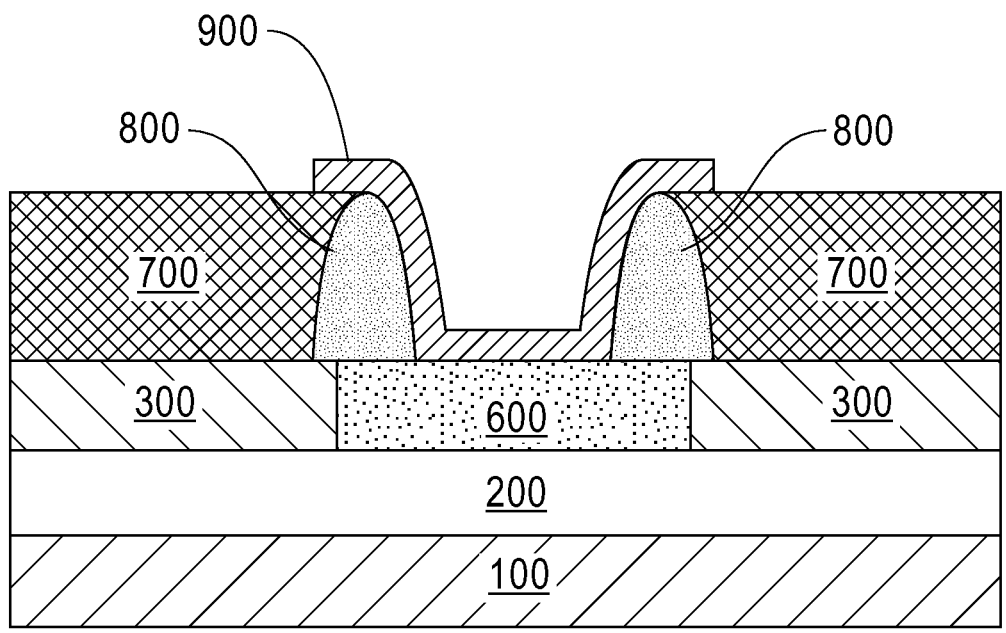
FIG. 13 illustrates patterning the polysilicon layer.
Figure 14:
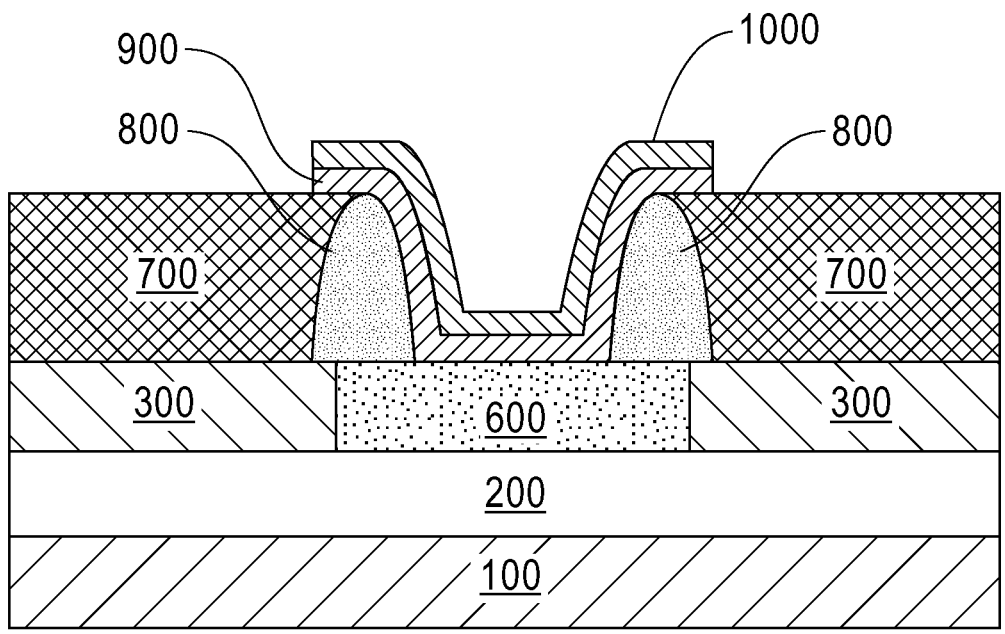
FIG. 14 illustrates depositing a silicide layer on top of the polysilicon layer.
Figure 15:
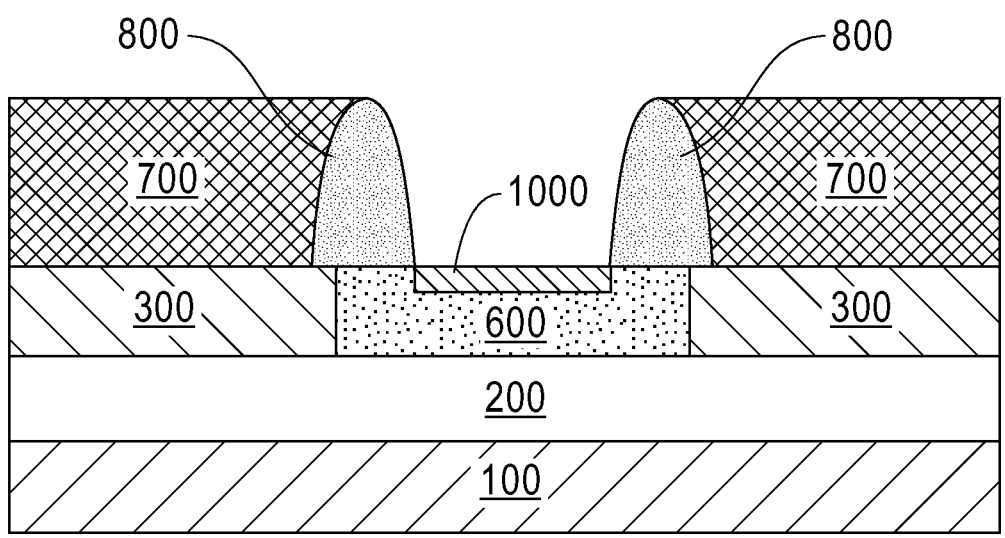
FIG. 15 illustrates forming a self aligned silicide according to one aspect of the invention.

In FIG. 12, similar to the process as described before, a polysilicon layer (900) is then deposited on top of the structure and into the gate base. In FIG. 13, the polysilicon layer (900) is then patterned so that it is covering the gate base region. In FIG. 14, a self-aligned silicide region is formed on the gate base region. According to an exemplary embodiment, the silicide region (1000) is formed by first depositing a non-transition metal, such as nickel-platinum (NiPt) on the gate base region, and then annealing to form the silicide. After silicide formation, any standard middle-of-the-line complementary metal-oxide-semiconductor (CMOS) processes including middle-of-the-line dielectric deposition, contact stud patterning, metal patterning and metallization can be implemented. In FIG. 15, the resulting structure according to one aspect of the invention is formed.

In another aspect of the invention, after the inner spacers (800) have been formed, the ILD layer is removed. Once the ILD layer is removed, the self aligned silicide will be deposited over the top surface of the structure. According to an exemplary embodiment, the silicide region is formed by first depositing a non-transition metal, such as nickel-platinum (NiPt) on the gate base region, and then annealing to form the silicide. After silicide formation, any standard middle-of-the-line complementary metal-oxide-semiconductor (CMOS) processes including middle-of-the-line dielectric deposition, contact stud patterning, metal patterning and metallization can be implemented.

Figure 16:
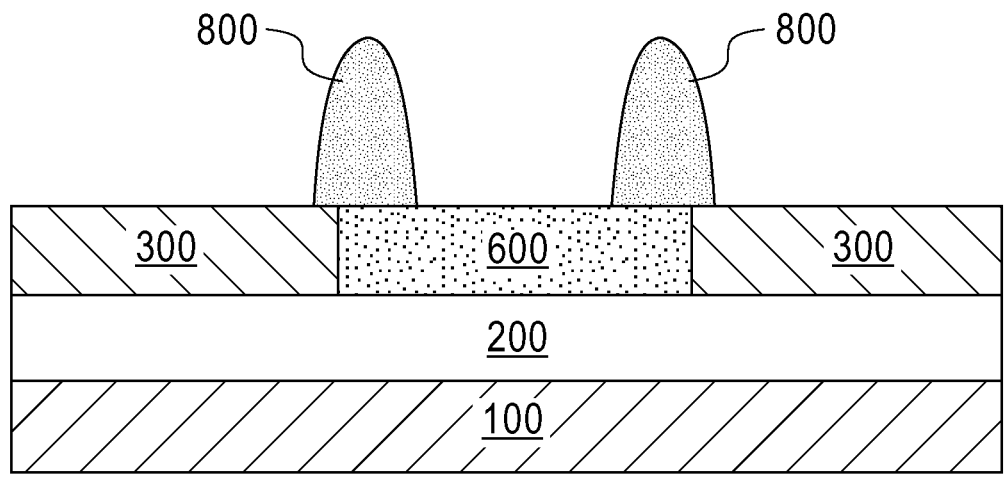
FIG. 16 illustrates removing the interlayer dielectric according to another aspect of the invention.
Figure 17:
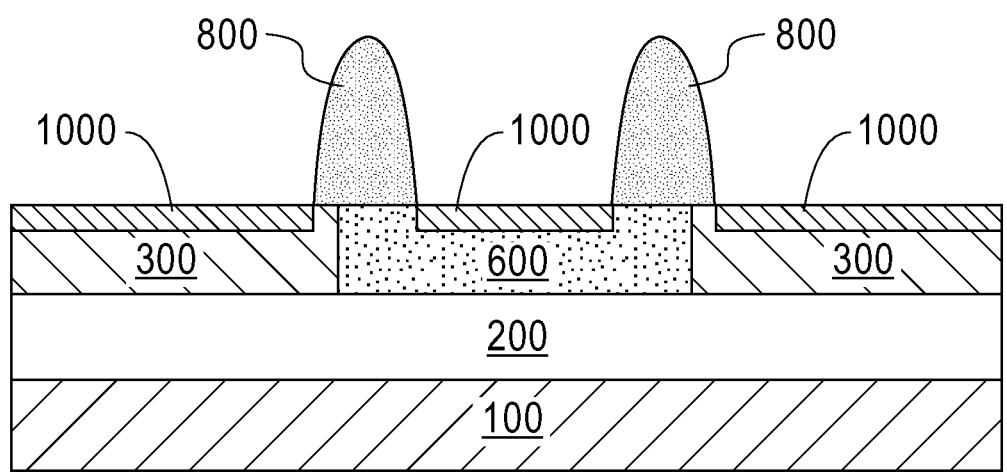
FIG. 17 illustrates forming a self aligned silicide.

In yet another aspect of the invention, another method is provided for creating the lateral bipolar transistor. Referring to FIG. 16, after removing the dummy gate (500), the ILD layer can be removed by either a wet method or dry method. A self-aligning silicide is then provided on the top surface of the structure. In FIG. 17, the silicide region (1000) is formed by first depositing a non-transition metal, such as nickel-platinum (NiPt) on the gate base region, and then annealing to form the silicide. After silicide formation, any standard middle-of-the-line complementary metal-oxide-semiconductor (CMOS) processes including middle-of-the-line dielectric deposition, contact stud patterning, metal patterning and metallization can be implemented.

Figure 18:
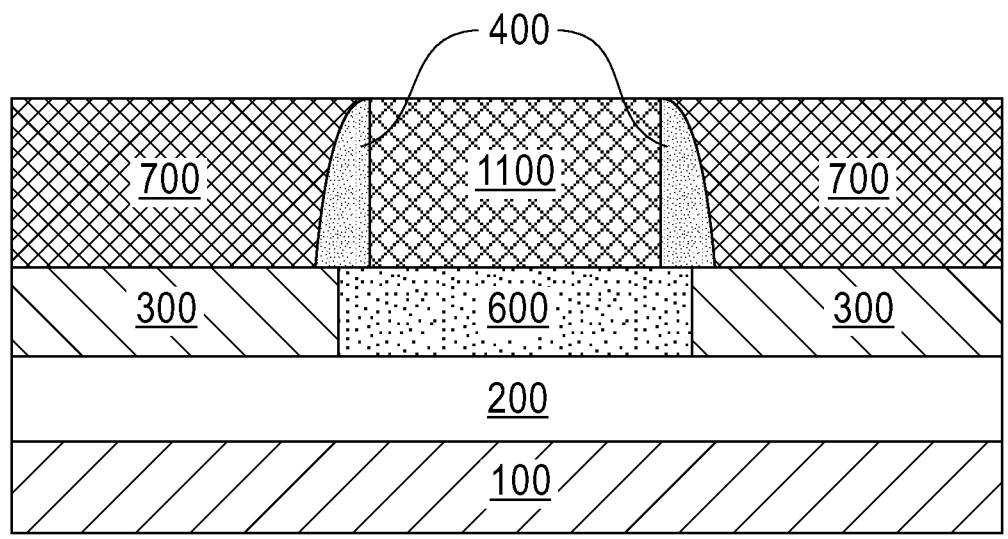
FIG. 18 illustrates epitaxially growing a base according to another aspect of the invention.
Figure 19:
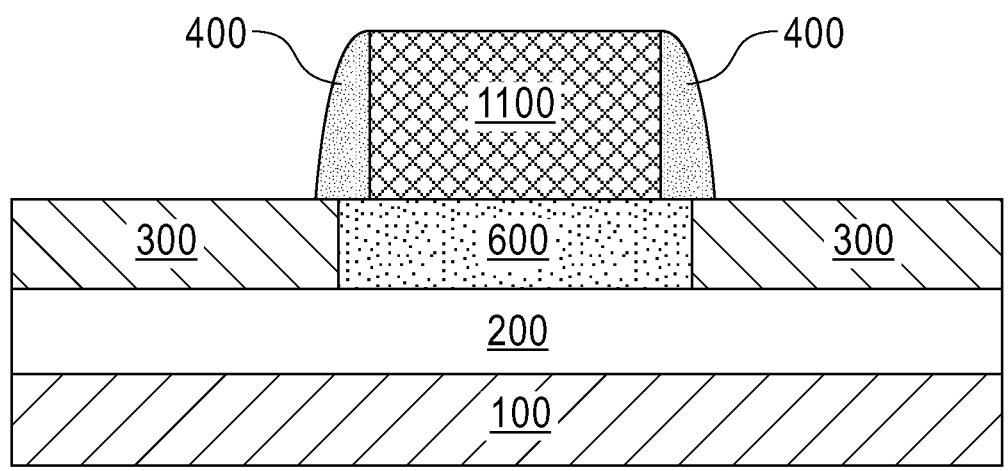
FIG. 19 illustrates stripping the interlayer dielectric layer.
Figure 20:
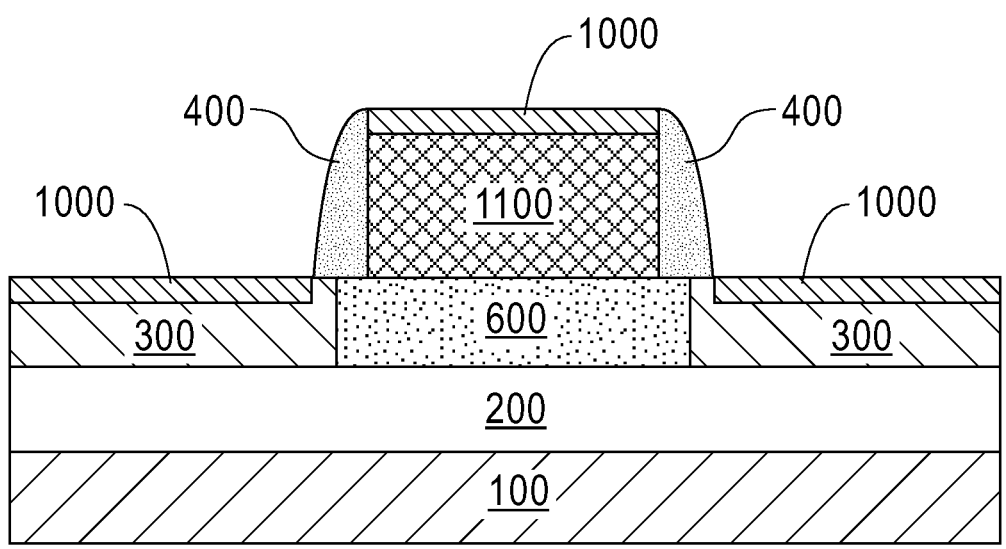
FIG. 20 illustrates forming a self aligned silicide according to one aspect of the invention.

In yet another aspect of the invention, another method is provided for creating the lateral bipolar transistor. In FIG. 18, after the base has been doped, the base contact (1100) is then formed by epitaxial growth. In FIG. 19, the ILD layer can be removed by either a wet method or dry method. A self-aligning silicide is then provided on the top surface of the structure. In FIG. 20, according to an exemplary embodiment, the silicide region is formed by first depositing a non-transition metal, such as nickel-platinum (NiPt) on the gate base region, and then annealing to form the silicide. After silicide formation, any standard middle-of-the-line complementary metal-oxide-semiconductor (CMOS) processes including middle-of-the-line dielectric deposition, contact stud patterning, metal patterning and metallization can be implemented.

It is to be understood that the sequence between the process steps shown in the accompanying figures and described herein can differ depending on the manner in which the present invention is used to create a final product such as a photovoltaic thin film structure. Given the teachings of the present invention, one of ordinary skill in the art will be able to contemplate these and similar implementations or configurations of the present invention.

It should also be understood that the above description is only representative of illustrative embodiments. For the convenience of the reader, the above description has focused on a representative sample of possible embodiments, a sample that is illustrative of the principles of the invention. The description has not attempted to exhaustively enumerate all possible variations. That alternative embodiment cannot have been presented for a specific portion of the invention, or that further undescribed alternatives can be available for a portion, is not to be considered a disclaimer of those alternate embodiments. Other applications and embodiments can be implemented without departing from the spirit and scope of the present invention.

It is therefore intended, that the invention not be limited to the specifically described embodiments, because numerous permutations and combinations of the above and implementations involving non-inventive substitutions for the above can be created, but the invention is to be defined in accordance with the claims that follow. It can be appreciated that many of those undescribed embodiments are within the literal scope of the following claims, and that others are equivalent.

The invention claimed is:

1. A method of forming a lateral bipolar transistor, the method comprising:
   forming a silicon on insulator (SOI) substrate having a bottom substrate layer, a buried oxide layer (BOX) on top of the substrate layer, and a silicon on insulator (SOI) layer on top of the BOX layer;
   forming a dummy gate and spacer on top of the silicon on insulator layer;
   initially doping the SOI layer at opposing sides of the dummy gate and spacer with dopant atoms of a first polarity type so as to define emitter and collector regions of the lateral bipolar transistor;
   depositing an interlayer dielectric (ILD);

planarizing the ILD by chemical mechanical planarization (CMP);

removing the dummy gate to form a gate trench which reveals only a base of the dummy gate, the base of the dummy gate comprising a portion of the SOI layer not initially doped;

doping the dummy gate base with dopant atoms of a second polarity type opposite the first polarity type so as to define a base region of the lateral bipolar transistor;

depositing a layer of polysilicon on top of the SOI layer and into the gate trench after doping the dummy gate base;

etching the layer of polysilicon so that it only covers the dummy gate base; and applying a self-aligned silicide process.

2. The method of claim 1, wherein doping the dummy gate base comprises solid source diffusion on the dummy gate base.

3. The method of claim 1, wherein doping the dummy gate base comprises implanting the dummy gate base with the dopant atoms of the second polarity type.

4. A method of forming a lateral bipolar transistor, the method comprising:

forming a silicon on insulator (SOI) substrate having a bottom substrate layer, a buried oxide layer (BOX) on top of the substrate layer, and a silicon on insulator (SOI) layer on top of the BOX layer;

forming a dummy gate and spacer on top of the silicon on insulator layer;

initially doping the SOI layer at opposing sides of the dummy gate and spacer with dopant atoms of a first polarity type so as to define emitter and collector regions of the lateral bipolar transistor;

depositing an interlayer dielectric (ILD);

planarizing the ILD by chemical mechanical planarization (CMP);

removing the dummy gate creating a gate trench so as to reveal only a base of the dummy gate, the base of the dummy gate comprising a portion of the SOI layer not initially doped;

doping the dummy gate base with dopant atoms of a second polarity type opposite the first polarity type so as to define a base region of the lateral bipolar transistor;

forming inner spacers on the sidewalls of the gate trench;

depositing a layer of polysilicon on top of the SOI layer and into the gate trench after doping the dummy gate base;

etching the layer of polysilicon so that it only covers the dummy gate base; and applying a self-aligned silicide process to form the lateral bipolar transistor.

5. The method as in claim 4, wherein doping the dummy gate base comprises using solid source diffusion on the dummy gate base.

6. The method as in claim 4, wherein doping the dummy gate base comprises implanting the dummy gate base with the dopant atoms of the second polarity type.

7. A method of forming a lateral bipolar transistor, the method comprising:

forming a silicon on insulator (SOI) substrate having a bottom substrate layer, a buried oxide layer (BOX) on top of the substrate layer, and a silicon on insulator (SOI) layer on top of the BOX layer;

forming a dummy gate and spacer on top of the silicon on insulator layer;

doping the SOI layer with dopant atoms of a first polarity type so as to define emitter and collector regions of the lateral bipolar transistor;

depositing an inter layer dielectric (ILD);

using chemical mechanical planarization (CMP) to planarize the ILD;

removing the dummy gate creating a cavity that reveals only the base of the dummy gate;

doping the dummy gate base with dopant atoms of a second polarity type opposite the first polarity type so as to define a base region of the lateral bipolar transistor;

growing epitaxially a base contact to the same level as the planarized ILD after doping the dummy gate base; and applying a self-aligned silicide process to form the lateral bipolar transistor.

8. The method as in claim 7, wherein doping the dummy gate base comprises using solid source diffusion on the dummy gate base.

9. The method as in claim 7, wherein doping the dummy gate base comprises implanting the dummy gate base with the dopant atoms of the second polarity type.

10. A method of forming a lateral bipolar transistor, the method comprising:

forming a silicon on insulator (SOI) substrate having a bottom substrate layer, a buried oxide layer (BOX) on top of the substrate layer, and a silicon on insulator (SOI) layer on top of the BOX layer;

forming a dummy gate and spacer on top of the silicon on insulator layer;

doping the SOI layer with dopant atoms of a first polarity type so as to define emitter and collector regions of the lateral bipolar transistor;

depositing an inter layer dielectric (ILD);

using chemical mechanical planarization (CMP) to planarize the ILD;

removing the dummy gate creating a gate trench which reveals only the base of the dummy gate;

doping the dummy gate base with dopant atoms of a second polarity type opposite the first polarity type so as to define a base region of the lateral bipolar transistor;

adding inner spacers on the sidewalls of the gate trench after doping the dummy gate base;

removing the ILD; and applying a self-aligned silicide process to form the lateral bipolar transistor.

11. The method as in claim 10, wherein doping the dummy gate base comprises using solid source diffusion on the dummy gate base.

12. The method as in claim 10, wherein doping the dummy gate base comprises implanting the dummy gate base with the dopant atoms of the second polarity type.

* * * * *